(12) United States Patent
Bouras

(10) Patent No.: US 9,041,193 B2
(45) Date of Patent: May 26, 2015

(54) SEMICONDUCTOR SUBSTRATE INCLUDING A COOLING CHANNEL AND METHOD OF FORMING A SEMICONDUCTOR SUBSTRATE INCLUDING A COOLING CHANNEL

(71) Applicant: Hamilton Sundstrand Corporation, Windsor Locks, CT (US)

(72) Inventor: Scott R. Bouras, Woodstock, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 14/176,538

(22) Filed: Feb. 10, 2014

(65) Prior Publication Data

US 2015/0076667 A1    Mar. 19, 2015

Related U.S. Application Data

(60) Provisional application No. 61/878,686, filed on Sep. 17, 2013.

(51) Int. Cl.
*H01L 23/34* (2006.01)
*H01L 23/367* (2006.01)
*H01L 25/16* (2006.01)
*H01L 25/00* (2006.01)

(52) U.S. Cl.
CPC ............ *H01L 23/367* (2013.01); *H01L 25/162* (2013.01); *H01L 25/50* (2013.01)

(58) Field of Classification Search
USPC .................. 257/712–176; 361/688–699, 703; 165/80.3, 80.4, 104.33
See application file for complete search history.

(56) References Cited

U.S. PATENT DOCUMENTS

| 4,450,472 | A | 5/1984 | Tuckerman et al. |
| 7,139,172 | B2 | 11/2006 | Bezama et al. |
| 7,203,064 | B2 | 4/2007 | Mongia et al. |
| 7,294,926 | B2 | 11/2007 | Schubert et al. |
| 7,782,616 | B1 | 8/2010 | Myers et al. |
| 8,294,261 | B2 | 10/2012 | Mawatari et al. |
| 2006/0108098 | A1* | 5/2006 | Stevanovic et al. .......... 165/80.4 |
| 2013/0105135 | A1 | 5/2013 | Kulah et al. |

OTHER PUBLICATIONS

Kim, Yoon Jo, et al., "Thermal Characterization of Interlayer Microfluidic Cooling of Three-Dimensional Integrated Circuits with Nonuniform Heat Flux", Journal of Heat Transfer, Copyright 2010 by ASME, Apr. 2010, vol. 132, pp. 0411009-1-041009-9.

(Continued)

*Primary Examiner* — Hsien Ming Lee
(74) *Attorney, Agent, or Firm* — Kinney & Lange, P.A.

(57) ABSTRACT

A semiconductor substrate for use in an integrated circuit, the semiconductor substrate including a channel defined on a surface of the substrate. The channel includes a first wall, a second wall, and a third wall. The first wall is recessed from the surface. The second wall extends from the surface to the first wall. The third wall extends from the surface to the first wall and faces the second wall across the channel. At least one of the second wall and the third wall includes a plurality of structures projecting into the channel from the second wall or the third wall.

10 Claims, 3 Drawing Sheets

(56) References Cited

OTHER PUBLICATIONS

Koo, Jae-Mo, et al., "Integrated Microchannel Cooling for Three-Dimensional Electronic Circuit Architectures", Journal of Heat Transfer, Copyright 2005 by ASME, Jan. 2005, vol. 127, pp. 49-58.

Lee, Young-Joon, et al., Co-Optimization and Analysis of Signal, Power, and Thermal Interconnects in 3-D ICs, IEEE Transactions on Computer-Aided Design of Integrated Circuits and Systems, vol. 30, No. 11, Nov. 2011, pp. 1635-1648.

* cited by examiner

SEMICONDUCTOR SUBSTRATE INCLUDING A COOLING CHANNEL AND METHOD OF FORMING A SEMICONDUCTOR SUBSTRATE INCLUDING A COOLING CHANNEL

CROSS-REFERENCE TO RELATED APPLICATION

This application claims priority to U.S. provisional application Ser. No. 61/878,686 entitled "SEMICONDUCTOR SUBSTRATE INCLUDING A COOLING CHANNEL AND METHOD OF FORMING A SEMICONDUCTOR SUBSTRATE INCLUDING A COOLING CHANNEL," filed Sep. 17, 2013, which is hereby incorporated by reference in its entirety.

BACKGROUND

The present invention relates to integrated circuits. In particular, the invention relates to cooling of integrated circuits.

There is increasing demand within the electronics industry for improved thermal management of electronic components. Higher performance integrated circuits expend greater energy to achieve desired levels of performance, and generate substantially greater heat as a byproduct. Such integrated circuits also have higher circuit density and a correspondingly smaller surface area available for removal of generated heat.

The problem of heat removal is even greater for 3-D integrated circuits. 3-D integrated circuits are three dimensional in that they include layers of two-dimensional integrated circuits stacked vertically Often, this is done by stacking two-dimensional integrated circuits face-to-face for two-layer stacks, or face-to-back for stacks of more than two layers. Typically, this requires that power and signal lines pass through a substrate upon which the two-dimensional circuit is integrated.

Some 3-D integrated circuits have been proposed that include channels in integrated circuit substrates through which a fluid flows to carry away heat. Such cooling channels, also called micro-fluidic channels, can be very effective at carrying away heat. However, as 3-D circuit integration of higher performance integrated circuits continues to develop, improvements in heat removal will be required.

SUMMARY

Embodiments of the present invention include a semiconductor substrate for use in an integrated circuit, the semiconductor substrate including a cooling channel defined on a surface of the substrate. The cooling channel includes a first wall, a second wall, and a third wall. The first wall is recessed from the surface. The second wall extends from the surface to the first wall. The third wall extends from the surface to the first wall and faces the second wall across the cooling channel. At least one of the second wall and the third wall includes a plurality of structures projecting into the cooling channel from the second wall or the third wall.

Another embodiment of the present invention is a method of defining a cooling channel on a semiconductor substrate. The method includes forming a trench in a surface of a first semiconductor wafer, the trench having a trench width. Then, a first slot is formed through a second semiconductor wafer. Next, a second slot is formed through a third semiconductor wafer. The first slot has a first slot width, and the first slot width is less than at least a portion of the trench width. The second slot has a second slot width, and the second slot width is greater than the first slot width. Then, the second semiconductor wafer is aligned to the first semiconductor wafer such that the first slot aligns with the trench. Next, the third semiconductor wafer is aligned to the second semiconductor wafer such that the second slot aligns with the first slot. Then, the first semiconductor wafer, the second semiconductor wafer, and the third semiconductor wafer are bonded together to form the semiconductor substrate. The trench, the first slot, and the second slot form walls of the cooling channel. Edges of the first slot project into the cooling channel.

DETAILED DESCRIPTION

Embodiments of the present invention include cooling channel in a semiconductor substrate for use with an integrated circuit. The cooling channel includes structures projecting into the cooling channel to increase heat transfer efficiency between the semiconductor substrate and a fluid flowing through the cooling channel. By projecting into the cooling channel, the structures provide increased surface area for heat transfer, enhancing the convective heat transfer rate and boosting the efficiency of heat transfer from the integrated circuit to a fluid flowing through the cooling channel. Some embodiments employ a series of fins projecting into the cooling channel. Other embodiments employ a series of posts projecting into the cooling channel. Additional surface area provided by the posts further enhances the heat transfer coefficient.

Figure 1:
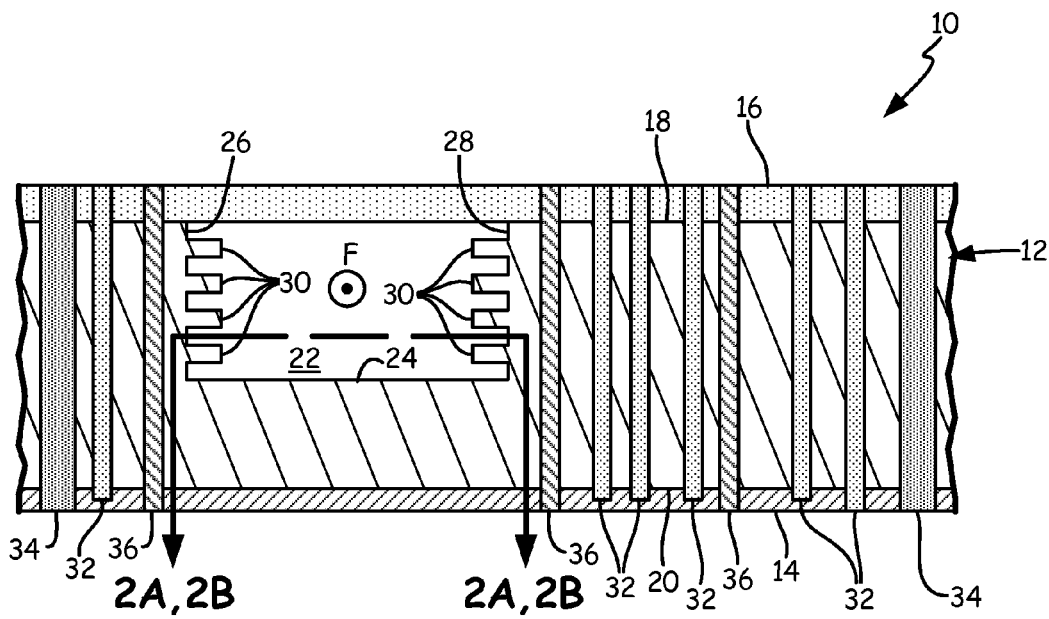
FIG. 1 is a schematic cross-section illustrating an electronic device embodying the present invention.

FIG. 1 is a schematic cross-section illustrating an electronic device embodying the present invention. As shown in FIG. 1, electronic device 10 includes substrate 12, integrated circuit layer 14, and backside layer 16. Substrate 12 includes first surface 18, second surface 20, and channel 22. Channel 22 includes first wall 24, second wall 26, third wall 28, and projecting structures 30. Substrate 12 is made of a semiconductor material, for example, silicon or gallium arsenide. Integrated circuit layer 14 includes a series of semiconductor devices. The semiconductor devices may include any type of semiconductor device known in the art, e.g. capacitors, diodes, transistors, resistors, etc. Backside layer 16 may be any type of material bondable to substrate 12 to provide a fluid-tight seal for channel 22. Examples of materials bondable to substrate 12 may include a polymer layer attached by an adhesive, a glass substrate attached by anodic bonding, a silicon substrate attached by diffusion bonding, and a ceramic substrate attached by metallic bonding.

Electronic device 10 may be attached to other electronic devices to construct a 3-D integrated circuit, as discussed below in reference to FIG. 3. Thus, as shown in FIG. 1, electrical device 10 also includes a plurality of Through-Silicon Vias (TSV), signal TSV 32, power TSV 34, and thermal TSV 36. TSVs are conductive pathways that pass through substrate 12 to permit conduction between first surface 18 and second surface 20. TSVs are typically created by employing a high-aspect ratio etching process, such as a deep reactive ion etch, to create a hole through substrate 12, and then filling the hole by depositing a conductor, such as copper. Some TSVs, such as signal TSVs 32, and power TSVs 34, are electrically conductive, providing electrical signals and electrical power connections to integrated circuit layer 14. Other TSVs, such as thermal TSVs 36, provide thermal conduction, transferring heat away from hot spots that may form during operation of integrated circuit layer 14. Thermal TSVs 36 are electrically isolated from integrated circuit layer 14.

As shown FIG. 1, first surface 18 and second surface 20 are on opposite sides of substrate 12. Integrated circuit layer 14 is formed at second surface 20. Signal TSVs 32 and power TSVs 34 electrically connect to integrated circuit layer 14 and extend through substrate 12 to provide electrical connections to integrated circuit layer 14 at backside layer 16. Thermal TSVs 36 thermally connect to integrated circuit layer 14 and extend through substrate 12 to provide thermal connections between integrated circuit layer 14 and backside layer 16.

Channel 22 is defined on first surface 18, and backside layer 16 is bonded to first surface 18 to provide a fluid-tight seal for channel 22. First wall 24 is recessed from first surface 18. Second wall 26 extends from first surface 18 to first wall 24. Third wall 28 also extends from first surface 18 to first wall 24, facing second wall 26 across channel 22. Projecting structures 30 project into channel 22 from second wall 26 and third wall 28. Alternatively, projecting structures 30 may project from only one of second wall 26 and third wall 28. Projecting structures 30 project (protrude or jut out) from second wall 26 and third wall 28 such that they overhang a portion of first wall 24.

In operation, electrical device 10 may be cooled by cooling fluid F flowing through channel 22. As shown in FIG. 1, cooling fluid F is flowing out of the page. Heat produced by operation of the semiconductor devices of integrated circuit layer 14 is conducted through substrate 12 to first wall 24, second wall 26, and third wall 28. The heat is convectively transferred from first wall 24, second wall 26, and third wall 28 to cooling fluid F by convective heat transfer as cooling fluid F flows past the walls. The rate at which the convective heat transfer occurs is proportional to the surface area exposed to the flow of cooling fluid F. Second wall 26 and third wall 28 include projecting structures 30 which project into channel 22 and into flow of cooling fluid F. Projecting structures 30 increase the surface area of second wall 26 and third wall 28 exposed to cooling fluid F. By projecting into channel 22, projecting structures 30 increase the surface area available for heat transfer by twice the extent of the their projection into channel 22. The increase in surface area available for heat transfer from second wall 26 and third wall 28 provided by projecting structures 30 increases the rate of convective heat transfer and boosts the efficiency of heat transfer from integrated circuit layer 14, through substrate 12, and into cooling fluid F flowing through channel 22.

Figure 2A:
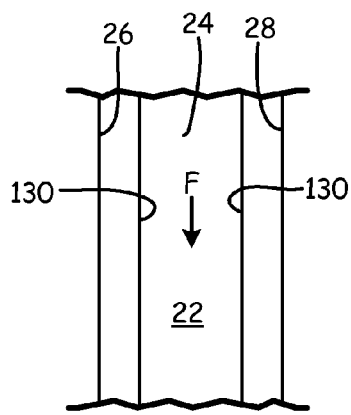
FIGS. 2A and 2B are top views of embodiments of FIG. 1.
Figure 2B:
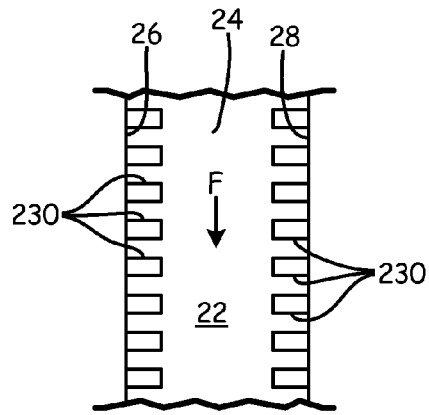

FIGS. 2A and 2B are top views showing two embodiments illustrating exemplary projecting structures which may be found in the embodiment of FIG. 1. In the embodiment of FIG. 2A, projecting structures 30 are fins 130 (only one shown on either side of channel 22 in the top view). Fins 130 project from second wall 26 and extend along at least a portion of second wall 26 in a direction parallel to first wall 24. Thus, fins 130 are also aligned parallel to the general flow of cooling fluid F to provide increased surface area for heat transfer while decreasing little the overall cross-sectional area of channel 22. FIG. 2A also shows fins 130 projecting from third wall 28 and extending along at least a portion of third wall 28 in a direction parallel to first wall 24. Alternatively, fins 130 may project from only one of second wall 26 and third wall 28.

In the embodiment of FIG. 2B, projecting structures 30 are rows of posts 230 (only one row shown on either side of channel 22 in the top view). Rows of posts 230 project from second wall 26 and extend along at least a portion of second wall 26 in a direction parallel to first wall 24. Thus, rows of posts 230 are also aligned parallel to the general flow of cooling fluid F to provide increased surface area for heat transfer while decreasing little the overall cross-sectional area of channel 22. Rows of posts 230 provide an additional increase in surface area beyond that provided by fins 130, due to the additional surface area available on post surfaces facing each other. Such posts may also be referred to as rectangular or square pin fins. In addition, rows of posts 230 may further improve the rate of convective heat transfer by producing turbulent flow in the vicinity of rows of posts 230. FIG. 2B also shows rows of posts 230 projecting from third wall 28 and extending along at least a portion of third wall 28 in a direction parallel to first wall 24. Alternatively, rows of posts 230 may project from only one of second wall 26 and third wall 28.

Figure 3:
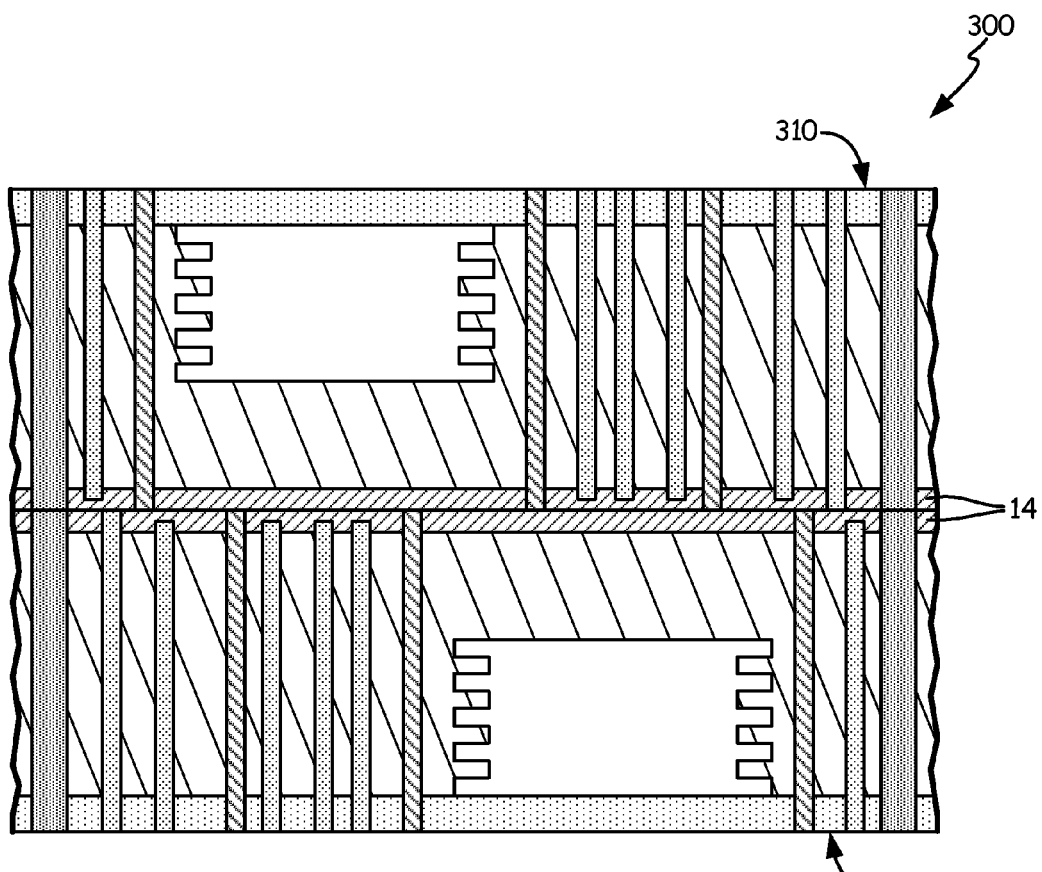
FIG. 3 is a schematic cross-section illustrating a 3-D electronic device embodying the present invention.

FIG. 3 is a schematic cross-section illustrating 3-D electronic device 300 embodying the present invention. FIG. 3 shows two electronic devices, first electronic device 310, and second electronic device 320. First electronic device 310 and second electronic device 320 are identical to electronic device 10 described above in reference to FIG. 1. First electronic device 310 and second electronic device 320 are physically and electrically bonded at integrated circuit layers 14 to form 3-D electronic device 300. Because each of first electronic device 310 and second electronic device 320 are identical to electronic device 10, they also have the increase in the convective heat transfer rate and improved efficiency of heat transfer provided by projecting structures 30. Thus, 3-D electronic device 300 benefits from improved heat removal provided embodiments of the present invention and required of high performance 3-D integrated circuits. Although FIG. 3 illustrates 3-D electronic device 300 in a face-to-face configuration, it is understood that embodiments of the present invention include 3-D electronic devices stacked and bonded in a face-to-back configuration.

Figure 4A:
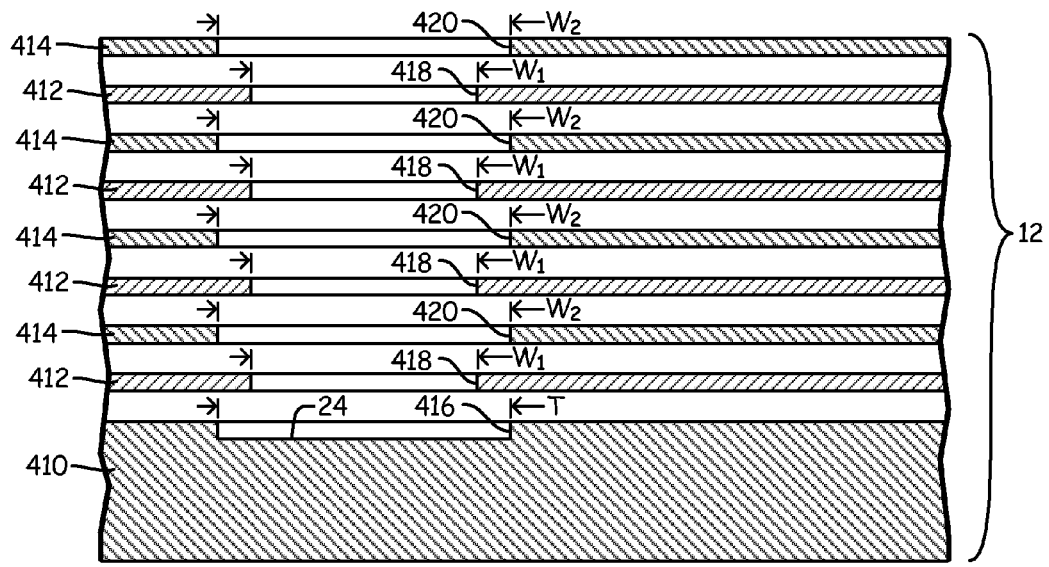
FIGS. 4A and 4B are cross-sections illustrating a method of building a semiconductor substrate for use with an integrated circuit, including a cooling channel embodying the present invention.
Figure 4B:
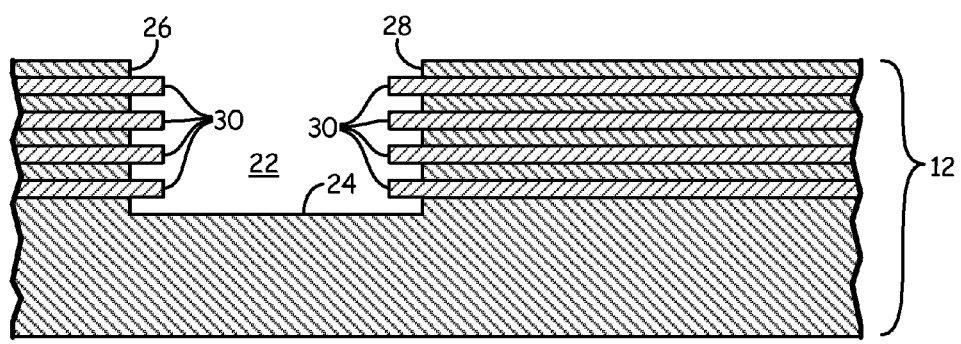

FIGS. 4A and 4B are cross-sections illustrating how separate semiconductor wafers may be assembled and bonded together to form a semiconductor substrate including a cooling channel embodying the present invention. FIG. 4A illustrates portions of separate semiconductor wafers aligned prior to bonding. Substrate 12 includes first semiconductor wafer 410, second semiconductor wafers 412, and third semiconductor wafers 414. First semiconductor wafer 410 includes trench 416 formed into a surface of the wafer, trench 416 having a trench width T. Trench 416 is a shallow portion of channel 22, the base of which forms first wall 24. Trench 416 is shown as having sidewalls that are parallel to each other and perpendicular to first wall 24. However, it is understood that the present invention encompasses embodiments where trench 416 has sidewalls having other shapes, including tapered, stepped, and curved.

Each second semiconductor wafer 412 includes first slot 418 formed through semiconductor wafer 412 and having a first slot width W1. Slot width W1 is less than at least a portion of trench width T. Each third semiconductor wafer 414 includes second slot 420 formed through semiconductor wafer 414 and having a second slot width W2. Slot width W2 is greater than first slot width W1. In the embodiment shown, slot width W2 is also about the same as trench width T. A pair of second semiconductor wafers 412 and third semiconductor wafers 414 is produced for each projecting structure 30 desired for channel 22 of substrate 12.

Forming trench 416, first slot 418, and second slot 420 may be done by, for example, wet chemical etching, plasma etching, ion milling, reactive ion etching, or any type of mechanical process for producing trenches or slots that is compatible with the semiconductor material. Alternatively, trench 416 may be formed by bonding a semiconductor wafer having a slot to a substrate having no trench to create first semiconductor wafer 410 and trench 416.

Assembly of substrate 12 begins as one of second semiconductor wafers 412 is aligned to, and brought into contact with, first semiconductor wafer 410 such that first slot 418 aligns with (is centered within) trench 416. Next, one of third semiconductor wafers 414 is aligned to, and brought into contact with, just aligned second semiconductor wafer 412 such that second slot 420 aligns with first slot 418, that is, first slot 418 is centered within second slot 420. Then, one of second semiconductor wafers 412 is aligned to, and brought into contact with, just aligned third semiconductor wafer 414 such that first slot 418 aligns with (is centered within) second slot 420. This process continues by alternating second semiconductor wafers 412 with third semiconductor wafers 414 to build up substrate 12. Once substrate 12 is assembled, first semiconductor wafer 410, second semiconductor wafers 412, and third semiconductor wafers 414 are bonded together to form substrate 12. The bonding may be, for example, diffusion bonding between the contacting semiconductor wafer layers. Once bonded, substrate 12 is a semiconductor substrate having a cooling channel, channel 22, into which edges of first slot 418 project, forming projecting structures 30. Thus, projecting structures 30 are integral to substrate 12. The edges of first slot 418 may be straight, forming fins 130, or have a toothed shape and form posts, such as posts 230, as shown in FIGS. 2A and 2B.

All embodiments shown are, for reasons of simplicity and clarity, illustrated only at a single electronic device level. However, it is understood that manufacturing such embodiments typically occurs at a wafer level and that embodiments of the present invention encompass such wafer level processing.

The embodiments described above are all describe a semiconductor substrate for use with an integrated circuit. The substrate includes a cooling channel having structures projecting into the cooling channel to increase heat transfer efficiency between the semiconductor substrate and a fluid flowing through the cooling channel. By projecting into the cooling channel, the structures provide increased surface area for heat transfer. The increased surface area enhances the convective heat transfer rate and boosts the efficiency of heat transfer from the integrated circuit to the fluid flowing through the cooling channel. In some embodiments, the improvement in heat transfer efficiency offered by the present invention permits the use of smaller cooling channels while providing sufficient thermal protection for the integrated circuit. In other embodiments, the improvement in heat transfer efficiency permits the integrated circuit to run at a higher power level, or the use of a reduced flow rate of cooling fluid, while providing sufficient thermal protection for the integrated circuit. As shown in FIG. 1, the TSVs and the cooling channel compete for limited space in the substrate of the electronic device. In some embodiments, smaller cooling channels permit greater flexibility in the number, size, and placement of TSVs.

Although the present invention has been described with reference to preferred embodiments, workers skilled in the art will recognize that changes may be made in form and detail without departing from the spirit and scope of the invention.
Discussion of Possible Embodiments The following are non-exclusive descriptions of possible embodiments of the present invention.

A semiconductor substrate including a cooling channel for use in an integrated circuit includes a cooling channel defined on a surface of the semiconductor substrate. The cooling channel includes a first wall recessed from the surface, a second wall extending from the surface to the first wall, and a third wall extending from the surface to the first wall, the third wall facing the second wall across the cooling channel. At least one of the second wall and the third wall include a plurality of structures projecting into the cooling channel from the second wall or the third wall.

The semiconductor substrate of the preceding paragraph can optionally include, additionally and/or alternatively, any one or more of the following features, configurations and/or additional components:

the semiconductor substrate is made of silicon;

the plurality of structures includes a first fin projecting from the second wall and extending along at least a portion of the second wall in a direction parallel to the first wall;

the plurality of structures further includes a second fin projecting from the third wall extending along at least a portion of the third wall in a direction parallel to the first wall;

the plurality of structures includes a first plurality of fins projecting from the second wall and extending along at least a portion of the second wall, and a second plurality of fins projecting from the third wall and extending along at least a portion of the third wall;

the plurality of structures includes a first row of posts projecting from the second wall, the row extending along at least a portion of the second wall in a direction parallel to the first wall;

the plurality of structures further includes a second row of posts projecting from the third wall, the row extending along at least a portion of the third wall in a direction parallel to the first wall; and the plurality of structures includes a first plurality of rows of posts projecting from the second wall and extending along at least a portion of the second wall, and a second plurality of rows of posts projecting form the third wall and extending along at least a portion of the third wall.

An electronic device including a semiconductor substrate as described in the preceding paragraphs, and an integrated circuit formed at a second surface on a side of the substrate opposite the surface upon which the cooling channel is defined.

An integrated 3D electronic device including a first electronic device as described in the preceding paragraph, and a second electronic device as described in the preceding paragraph. The first electronic device and the second electronic device are electrically and physically bonded to form the 3D electronic device.

A method of forming a semiconductor substrate including a cooling channel includes forming a trench in a surface of a first semiconductor wafer, forming a first slot through a second semiconductor wafer, and forming a second slot through a third semiconductor wafer. The trench has a trench width. The first slot has a first slot width that is less than at least a portion of the trench width. The second slot has a second slot width that is greater than the first slot width. Next, the second semiconductor wafer is aligned to the first semiconductor wafer such that the first slot aligns with the trench, and the third semiconductor wafer is aligned to the second semiconductor wafer such that the second slot aligns with the first slot. Then, the first semiconductor wafer, the second semiconductor wafer, and the third semiconductor wafer are bonded together to form the semiconductor substrate. The trench, the first slot, and the second slot form walls of the cooling channel. Edges of the first slot project into the cooling channel.

The method of forming a semiconductor substrate of the preceding paragraph can optionally include, additionally and/or alternatively, the feature that the edges of the first slot include a toothed shape forming a row of posts extending into the cooling channel.

A method of producing an electronic device including a cooling channel includes defining the cooling channel on a semiconductor substrate as described above, and producing an integrated circuit at a second surface on a side of the substrate opposite the surface upon which the cooling channel is defined.

A method of cooling an electronic device includes producing an electronic device including a cooling channel as described in the preceding paragraph, and flowing a fluid through the cooling channel and past the edges of the first slot projecting into the cooling channel to cool the electronic device.

A method of producing an integrated 3D electronic device including cooling channels includes producing a first electronic device as described in the preceding paragraph, and producing a second electronic device as described in the preceding paragraph. Then, bonding the first electronic device to the second electronic device to form the integrated 3D electronic device, in which the bonding is both electrical and physical.

The invention claimed is:

1. A semiconductor substrate including a cooling channel for use in an integrated circuit, the substrate comprising:
   a cooling channel defined on a surface of the semiconductor substrate, the cooling channel including:
   a first wall recessed from the surface;
   a second wall extending from the surface to the first wall; and
   a third wall extending from the surface to the first wall, the third wall facing the second wall across the cooling channel;
   wherein at least one of the second wall and the third wall include a plurality of structures projecting into the cooling channel from the second wall or the third wall.

2. The substrate of claim 1, wherein the semiconductor substrate is made of silicon.

3. The substrate of claim 1, wherein the plurality of structures includes a first fin projecting from the second wall and extending along at least a portion of the second wall in a direction parallel to the first wall.

4. The substrate of claim 3, wherein the plurality of structures further includes a second fin projecting from the third wall extending along at least a portion of the third wall in a direction parallel to the first wall.

5. The substrate of claim 1, wherein the plurality of structures includes:
   a first plurality of fins projecting from the second wall and extending along at least a portion of the second wall; and
   a second plurality of fins projecting from the third wall and extending along at least a portion of the third wall.

6. The substrate of claim 1, wherein the plurality of structures includes a first row of posts projecting from the second wall, the row extending along at least a portion of the second wall in a direction parallel to the first wall.

7. The substrate of claim 6, wherein the plurality of structures further includes a second row of posts projecting from the third wall, the row extending along at least a portion of the third wall in a direction parallel to the first wall.

8. The substrate of claim 1, wherein the plurality of structures includes:
   a first plurality of rows of posts projecting from the second wall and extending along at least a portion of the second wall; and
   a second plurality of rows of posts projecting form the third wall and extending along at least a portion of the third wall.

9. An electronic device including:
   a semiconductor substrate as claimed in claim 1; and
   an integrated circuit formed at a second surface on a side of the substrate opposite the surface upon which the cooling channel is defined.

10. An integrated 3D electronic device including:
    a first electronic device as claimed in claim 9; and
    a second electronic device as claimed in claim 9;
    wherein the first electronic device and the second electronic device are electrically and physically bonded to form the 3D electronic device.

* * * * *